United States Patent
Hayashi et al.

(10) Patent No.: US 6,174,344 B1
(45) Date of Patent: Jan. 16, 2001

(54) COPPER FINE POWDER AND METHOD FOR PREPARING THE SAME

(75) Inventors: Takao Hayashi; Yoshinobu Nakamura, both of Yamaguchi; Hiroyuki Shimamura, Tokyo, all of (JP)

(73) Assignee: Mitsui Mining and Smelting Co., Ltd., Tokyo (JP)

( * ) Notice: Under 35 U.S.C. 154(b), the term of this patent shall be extended for 0 days.

(21) Appl. No.: 09/088,490

(22) Filed: Jun. 2, 1998

(30) Foreign Application Priority Data

Jun. 4, 1997 (JP) .................................................. 9-146336

(51) Int. Cl.⁷ ...................................................... C22C 9/00
(52) U.S. Cl. ............................. 75/255; 148/432; 420/469
(58) Field of Search ............................. 75/255; 420/469; 148/411, 432

(56) References Cited

U.S. PATENT DOCUMENTS

| | | | |
|---|---|---|---|
| 4,944,797 | * 7/1990 | Kemp et al. | 420/469 |
| 5,409,520 | * 4/1995 | Mori et al. | 420/469 |

FOREIGN PATENT DOCUMENTS

| | | |
|---|---|---|
| 2-197012 | 8/1990 | (JP) . |
| 2-294414 | 12/1990 | (JP) . |
| 4-116109 | 4/1992 | (JP) . |
| 4-235205 | 8/1992 | (JP) . |
| 09-003510 | * 1/1997 | (JP) . |

* cited by examiner

*Primary Examiner*—George Wyszomierski
(74) *Attorney, Agent, or Firm*—Young & Thompson

(57) ABSTRACT

Copper fine powder has an electrical resistance in its powdery state of not more than $1 \times 10^{-3}\Omega\cdot\text{cm}$; a BET specific surface area ranging from 0.15 to 0.3 m²/g; a tap density of not less than 4.5 g/cc; a product of the tap density and the particle size, of not less than 13, the particle size being calculated from the specific surface area and a particle size distribution observed in the microtrack measurement as expressed in terms of $D_{50}$ and $D_{90}$ ranging from 4 to 7 μm and 9 to 11 μm, respectively; and a weight loss through hydrogen-reduction of not more than 0.30%. The copper fine powder is prepared by adding an alkali hydroxide to an aqueous copper salt solution containing divalent copper ions maintained at not less than 55° C. in an amount of not less than the chemical equivalent to form cupric oxide; then gradually adding a reducing sugar to the reaction system while maintaining the temperature of the system to not less than 55° C. to reduce the cupric oxide to cuprous oxide; followed by filtration and washing, re-suspension to form a slurry, gradual addition of a hydrazine reducing agent to the slurry in the presence of a pH buffer capable of maintaining the pH to 5.5 to 8.5 to thus reduce the cuprous oxide to metal copper.

1 Claim, 1 Drawing Sheet

COPPER FINE POWDER AND METHOD FOR PREPARING THE SAME

BACKGROUND OF THE INVENTION (a) Field of the Invention

The present invention relates to copper fine powder which has a considerably low electrical resistance in its powdery state, is excellent in packing properties and has sharp particle size distribution as well as a method for preparing the copper fine powder. More particularly, the present invention pertains to copper fine powder used in making a copper paste which is suitably used for forming an electric conductor pattern on a resin substrate mainly used as an electronic circuit, in particular, a multilayer printed wiring board as well as a method for preparing such copper fine powder.

(b) Description of the Prior Art

Conventionally, copper fine powder has been used as a raw material for the so-called paste to be fired, i.e., a paste which is applied onto a substrate for electronic machinery and tools, such as a glass or ceramic substrate by the screen printing or the direct drawing and then fired to give a thick film.

Recently, there has been desired for the development of such electronic machinery and tools each having a higher packaging density along with the development of high speed, digital electronic machinery and tools for the purposes of miniaturization and weight-reduction thereof and for further functionalization thereof. Nevertheless, circuit boards have conventionally been prepared by the through hole method wherein through holes are formed in a substrate by drilling operations and the substrate is then plated. There are technical limits in these conventional methods and they have not been able to satisfy the foregoing requirements.

As a means for satisfying the foregoing requirements, the development of a multilayer printed wiring board having a via hole (VH) structure has become of major interest lately. In this respect, the via hole structure may cope with not only the reduction in the substrate size, but also automatic design for distributing wires and digital high speed processing of signals.

The multilayer printed wiring board having such a VH structure has been produced by filling the holes formed in the substrate with a solvent free type heat-curable conductive paste which comprises copper fine powder, a resin and a curing agent; sandwiching the substrate between two copper foils; and then subjecting the assembly to heat and pressure. The heat-curable conductive paste used for the production of the printed board must further satisfy such requirements that the copper fine powder as an electrical conductor should have further excellent characteristic properties such as conductivity and packing properties since any evaporation of organic binders and solvents does not cause, unlike the conventional paste to be fired.

With regard to the copper fine powder, various attempts have conventionally been done to improve the copper fine powder so that it has characteristic properties, which make the use thereof in the solvent-containing paste to be fired favorable, for instance, the shape, particle size, particle size distribution and tap density of the copper fine powder, but there have not yet sufficiently been investigated characteristic properties of the copper fine powder which make the use thereof in the solvent-free heat-curable conductive paste favorable. Accordingly, there has not yet been proposed any copper fine powder capable of satisfying the requirements for the characteristic properties of the copper fine powder which permit favorable use thereof in the solvent-free heat-curable conductive paste.

There have conventionally been proposed various kinds of methods for preparing copper fine powder such as mechanical pulverization methods, atomization methods, electrolysis methods, evaporation methods and wet-reduction methods. The wet-reduction methods have been recognized to be preferred methods for preparing copper fine powder for use in the paste to be fired and, in particular, several reduction methods using hydrazine have conventionally been proposed as appropriate means for preparing copper fine powder having a particle size on the order of 0.1 to 100 $\mu$m.

Typical examples of such methods are production methods as disclosed in, for instance, Japanese Un-Examined Patent Publication (hereinafter referred to as "J. P. KOKAI") Nos. Hei 2-294414, Hei 4-116109 and Hei 4-235205.

J. P. KOKAI No. Hei 2-294414 discloses a method for preparing copper powder which comprises the steps of adding an alkali hydroxide and a reducing sugar to an aqueous copper salt solution in the presence of at least one compound selected from the group consisting of amino acids and salts thereof, ammonia and ammonium salts, organic amines and dimethylglyoxime to thus precipitate copper suboxide particles; and then reducing the copper suboxide particles with hydrazine.

In addition, J. P. KOKAI No. Hei 4-116109 discloses a method which comprises reducing an aqueous copper salt solution into metal copper particles through copper hydroxide and copper suboxide. In respect of the method, this patent also describes that a reducing sugar and then a hydrazine reducing agent are added to the aqueous copper salt solution after adjusting the pH value of the solution to a level of not less than 12, that the temperature of the reaction solution is controlled to not less than 60° C. prior to the addition of the hydrazine reducing agent and that a chelating agent such as a Rochelle salt, an amino acid, ammonia or an ammonium compound is usable to maintain stable dispersion of copper (II) ions in the aqueous solution.

Moreover, J. P. KOKAI No. Hei 4-235205 discloses a reduction method identical to that disclosed in the foregoing J. P. KOKAI No. Hei 4-116109 except that the former further comprises the step of adding a protective colloid to the aqueous solution in portions.

The foregoing Japanese Un-Examined Patent Publications listed above disclose that the copper fine powder prepared by the method disclosed therein is, for instance, characterized in that it has a narrow particle size distribution and a small particle size, but the copper fine powder has still been insufficient for use as a raw material of heat-curable conductive pastes for filling up VH's since the particle size distribution thereof is still wide and there is observed a bias in the particle size towards the side of smaller size.

SUMMARY OF THE INVENTION

Regarding the resin substrate for the multilayer printed wiring board having a VH structure, the existence of the cured resin among the copper fine powder as a conductor in the VH structure becomes a cause of an increase in the electrical resistance, unlike the conventional paste to be fired. In addition, the via holes are filled with a heat-curable conductive paste according to, for instance, a method using a squeegee, but when the particle size of the copper fine powder in the heat-curable conductive paste varies widely, there is observed such a tendency that the via holes are first filled with coarse particles and the heat-curable conductive paste accommodated in the squeegee has thus an increasingly high rate of fine particles in proportion thereto. For this reason, the viscosity of the paste remaining in the squeegee stepwise increases as the number of the substrates to be treated with one batch of the paste accommodated in the squeegee increases and finally the via holes cannot be filled with the paste or insufficiently filled therewith or the paste is adhered to or remains on portions on the substrate other than the via holes.

The copper fine powder used in the heat-curable conductive paste should have the following characteristic properties in order to eliminate or suppress the aforementioned drawbacks:

(1) The copper fine powder should have a sufficiently low electrical resistance as determined in its powdery state;

(2) It should be excellent in the packing characteristics which may ensure the conductivity of the heat-cured conductive paste in the VH;

(3) The content of the copper fine powder in the heat-curable conductive paste can be increased; and (4) The paste may have an appropriate viscosity, while satisfying the requirement specified in (3).

Accordingly, an object of the present invention is to solve the foregoing problems associated with the conventional copper fine powder as well as the methods for preparing the same and more specifically to provide copper fine powder usable in a heat-curable conductive paste and which can satisfy all of the requirements listed above.

Another object of the present invention is to provide a method for preparing the foregoing copper fine powder which can satisfy all of the foregoing requirements.

The inventors of this invention have conducted various studies to accomplish the foregoing objects, have found out that copper fine powder can satisfy all of the foregoing requirements when it has an electrical resistance as determined in the form of its powdery state, a specific surface area as determined by the BET method, a tap density, a product of the tap density and a particle size which is calculated from the specific surface area, a particle size distribution as determined by the microtrack measurement and a weight loss through hydrogen-reduction each falling within a specific range and that the copper fine powder which satisfies all of the foregoing requirements can be prepared by a specific method and thus have completed the present invention.

According to an aspect of the present invention, there is provided copper fine powder which has an electrical resistance, as determined in the form of its powdery state, of not more than $1\times10^{-3}$ Ω.cm; a specific surface area, as determined by the BET method, ranging from 0.15 to 0.3 m$^2$/g; a tap density of not less than 4.5 g/cc; a product of the tap density (g/cc) and the particle size ($\mu$m), of not less than 13, the particle size ($\mu$m) being calculated from the specific surface area according to the following equation:

Particle Size($\mu$m)=6/[8.93×[specific surface area, as determined by the BET method (m$^2$/g)]];

a particle size distribution observed in the microtrack measurement as expressed in terms of $D_{50}$ and $D_{90}$ ranging from 4 to 7 $\mu$m and 9 to 11 $\mu$m, respectively; and a weight loss through hydrogen-reduction of not more than 0.30%.

According to another aspect of the present invention, there is also provided a method for preparing copper fine powder, which comprises the steps of adding an alkali hydroxide to an aqueous copper salt solution containing divalent copper ions maintained at a temperature of not less than 55° C. in an amount of not less than the chemical equivalent to form cupric oxide; then gradually adding a reducing sugar to the reaction system while maintaining the temperature of the system to not less than 55° C. to reduce the cupric oxide to cuprous oxide; followed by filtration and washing, again converting into a slurry, gradual addition of a hydrazine reducing agent to the slurry in the presence of a pH buffer capable of maintaining the pH to the range of from 5.5 to 8.5 to thus reduce the cuprous oxide to metal copper.

DESCRIPTION OF THE PREFERRED EMBODIMENTS

Figure 1:
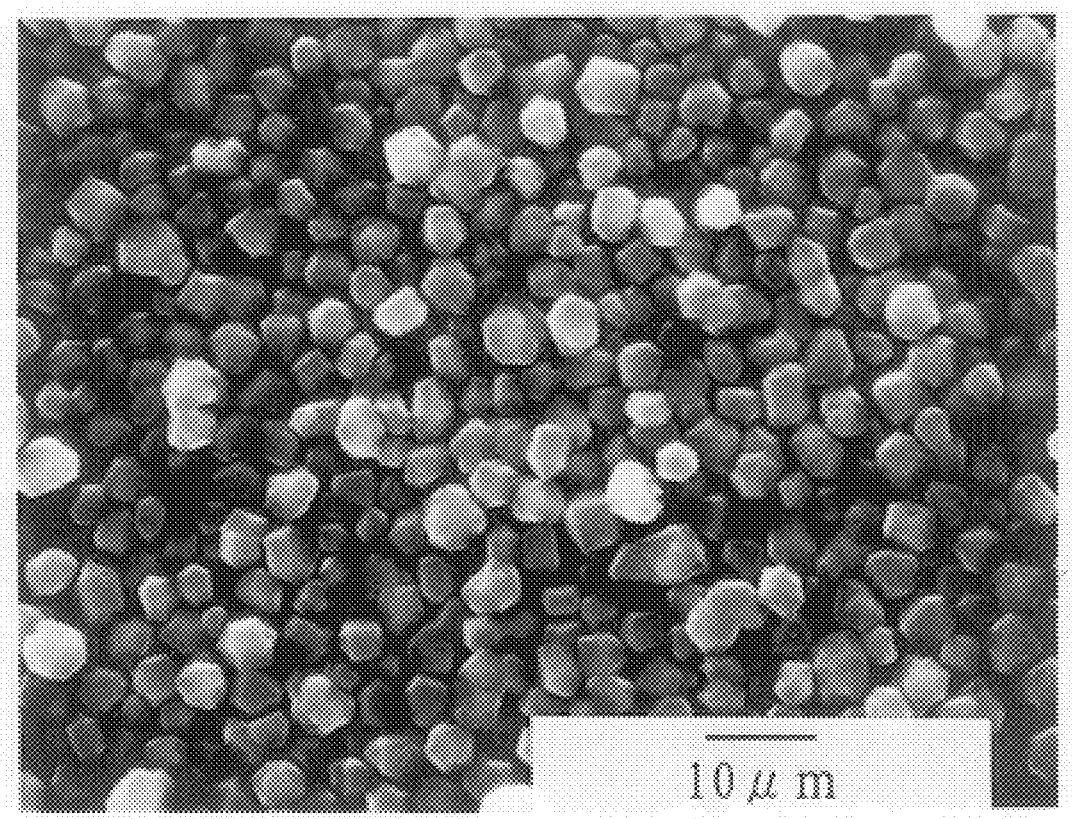
FIG. 1 is a micrograph showing the copper fine powder prepared in Example 1.

The present invention will hereinafter be described in more detail with reference to preferred embodiments given below.

The copper fine powder according to the present invention has an electrical resistance as determined in the form of its powdery state of not more than $1\times10^{-3}$ Ω.cm. This is because if the electrical resistance exceeds $1\times10^{-3}$ Ω.cm and the heat-curable conductive paste comprising the copper fine powder is used for preparing a resin substrate for multilayer printed wiring boards each having a VH structure, the VH portion of the resulting resin substrate has a high electrical resistance.

In addition, the copper fine powder of the present invention has a specific surface area, as determined by the BET method, ranging from 0.15 to 0.3 m$^2$/g. If the heat-curable conductive paste prepared from the copper fine powder, whose specific surface area as determined by the BET method is less than 0.15 m$^2$/g, is used for producing a resin substrate for multilayer printed wiring boards each having a VH structure, the viscosity of the paste filled in the VH structure is extremely low and this results in the formation of voids at the center of the paste thus charged in the structure and the occurrence of such a phenomenon that the paste in the voids downward runs. On the other hand, if the specific surface area, as determined by the BET method exceeds 0.3 m$^2$/g, the resulting copper powder has a small particle size and gradually undergoes agglomeration, this leads to an increase in the viscosity of the resulting paste, it becomes increasingly difficult to charge the holes on the substrate with the heat-curable conductive paste as the viscosity of the paste increases and accordingly, the ability of the paste to produce substrates (productivity) is reduced.

The copper fine powder according to the present invention has a tap density of not less than 4.5 g/cc. If the heat-curable conductive paste prepared from the copper fine powder whose tap density is less than 4.5 g/cc is used for producing a resin substrate for multilayer printed wiring boards each having a VH structure, the rate of the copper fine powder packed in the VH structure is insufficient and as a result, the electrical resistance of the vH portion increases.

The copper fine powder according to the present invention has a product of the tap density (g/cc) and the particle size ($\mu$m), of not less than 13, the particle size ($\mu$m) being calculated from the specific surface area according to the following equation:

Particle Size($\mu$m)=6/[8.93×[specific surface area, as determined by the BET method (m$^2$/g)]].

If the product of the tap density and the particle size is less than 13, for instance, if the particle size of the copper fine powder is too small, while the tap density is sufficiently high, the viscosity of the resulting heat-curable conductive paste increases, it becomes increasingly difficult to charge the holes on the substrate with the heat-curable conductive paste as the viscosity of the paste increases and accordingly, the ability of producing substrates (productivity) is reduced. Alternatively, if the tap density is too low, while the particle size falls within the predetermined range and if the heat-curable conductive paste prepared from this copper fine powder is used for producing a resin substrate for multilayer printed wiring boards each having a VH structure, the rate of the copper fine powder packed in the VH structure is insufficient and the electrical resistance of the VH portion increases in proportion to the insufficiency.

The copper fine powder of the present invention has a particle size distribution observed in the microtrack measurement as expressed in terms of $D_{50}$ and $D_{90}$ ranging from 4 to 7 $\mu$m and 9 to 11 $\mu$m, respectively. This is because if $D_{50}$ is less than 4 $\mu$m or $D_{90}$ is less than 9 $\mu$m and if the heat-curable conductive paste prepared from this copper fine powder is used for producing a resin substrate for multilayer printed wiring boards each having a VH structure, the viscosity of the paste filled in the VH structure is extremely low and this results in the formation of voids at the center of the paste thus charged in the structure and the occurrence of such a phenomenon that the paste in the voids downward runs. On the other hand, if the $D_{50}$ more than 7 $\mu$m or $D_{90}$ is more than 11 $\mu$m, the resulting copper powder severely undergoes agglomeration, this leads to an increase in the viscosity of the resulting paste, it becomes increasingly difficult to charge the holes on the substrate with the heat-curable conductive paste as the viscosity of the paste increases and accordingly, the ability of the paste to produce substrates (productivity) is reduced.

According to another aspect of the present invention, there is also provided a method for preparing the copper fine powder explained above in detail.

In the method for preparing copper fine powder according to the present invention, an alkali hydroxide is added to an aqueous copper salt solution containing divalent copper ions maintained at a temperature of not less than 55° C. and preferably ranging from 60 to 70° C., in an amount of not less than the chemical equivalent and preferably 1 to 2 times the chemical equivalent to form cupric oxide.

Examples of copper salts containing divalent copper ions usable in the foregoing step are cupric sulfate, cupric chloride, cupric nitrate and cupric acetate.

This step for generating the cupric oxide is necessary at any cost, in order to ensure the effective progress of the subsequent reduction step with a reducing sugar. Moreover, if the temperature of the copper salt aqueous solution is less than 55° C. or the amount of the alkali hydroxide is less than the reaction equivalent on the basis of the amount of the divalent copper ions, there are observed scatter in the shape and particle size distribution of the copper fine powder ultimately obtained and the progress of the reaction is adversely affected.

In this respect, the prior art patents listed above disclose the formation of copper hydroxide using alkali hydroxides or the like, but they do not disclose or suggest complete conversion of divalent copper ions into cupric oxide using an excess of an alkali.

Then a reducing sugar is gradually added to the reaction system while maintaining the temperature of the reaction system to not less than 55° C. , preferably ranging from 60 to 70° C. to thus reduce the cupric oxide formed in the foregoing step to cuprous oxide. At this stage, if the temperature is less than 55° C. or the reducing sugar is added in one portion, i.e., the reducing sugar is not gradually added, there are likewise observed scatter in the shape and particle size distribution of the copper fine powder ultimately obtained.

Thereafter, the slurry of the cuprous oxide thus prepared is then subjected to filtration and washing and the cuprous oxide is re-suspended in a medium to give a slurry at a neutral pH condition, followed by gradual addition of a hydrazine reducing agent to the slurry in the presence of an appropriate pH buffer capable of maintaining the pH to the range of from 5.5 to 8.5, preferably ranging from 6 to 7.5 to thus reduce the cuprous oxide to metal copper.

Examples of the pH buffers usable herein include aminoacetic acid and examples of the hydrazine reducing agents usable herein are hydrazine, hydrazine hydrate, hydrazine sulfate, hydrazine carbonate and hydrazine hydrochloride.

The prior art patents discussed above disclose the addition of a variety of additives to the initial copper salt aqueous solution in order to stabilize the divalent copper ions present in the solution, but the reducing treatment of the copper suboxide slurry is carried out while maintaining the alkaline atmosphere. In such an alkaline pH region, a large amount of copper fine powder-forming nuclei are generated because of the strong reducing power of the hydrazine reducing agent and accordingly, the resulting copper fine powder has a small particle size relative to the desired one and scatter in the particle size and are agglomerated to a considerable extent. Thus, the heat-curable conductive paste prepared using the resulting copper fine powder has a high viscosity and the rate of charging the VH's with the paste is correspondingly impaired and the foregoing desired effects of the present invention cannot be expected.

The inventors of this invention have developed a method for eliminating or suppressing such bad effects, which comprises filtering the cuprous oxide slurry, washing and then re-suspending the cuprous oxide in a medium to form a slurry at a neutral pH region, prior to the reduction with a hydrazine reducing agent to thus add a pH buffer upon the reduction.

In the production method of the present invention, it is very important to filter and wash the cuprous oxide slurry and then re-suspend the product to form a slurry. If these treatments are omitted, the copper fine powder ultimately obtained has an electrical resistance, as determined in the form of its powdery state, of more than $1 \times 10^{-3} \Omega.cm$; a specific surface area, as determined by the BET method, of greater than 0.3 $m^2/g$; a product of the tap density and the particle size, of less than 13, the particle size being calculated from the specific surface area as determined by the BET method; the particle size distribution observed during the microtrack measurement as expressed in terms of $D_{50}$ of less than 4 $\mu$m and $D_{90}$ of less than 9 $\mu$m; and/or a weight loss through hydrogen-reduction of more than 0.30%.

In the production method of the present invention, when cuprous oxide is reduced to metallic copper, the use of, for instance, aminoacetic acid having the isoelectric point at a pH of about 6 as the pH buffer permits the maintenance of the concentration of the hydrazine reducing agent present in the slurry, which is consumed along with the progress of the reduction reaction, at an approximately constant level, since it would be assumed that this pH buffer takes part in the catalytic reaction for stabilizing the concentration of the hydrazine reducing agent in the slurry or that the buffer forms a condensate with the hydrazine reducing agent.

In the production method according to the present invention, there is used a pH buffer which is suitable for controlling the pH of the reaction system to a level of 5.5 to 8.5. If the pH value maintained by the pH buffer is less than 5.5 or exceeds 8.5, the desired effects of the present invention discussed above cannot be anticipated. In addition, the rate of the pH buffer, based on the amount of copper, ranges from about 0.01 to 1 mole/mole of copper, preferably about 0.05 to 0.4 mole/mole of copper. If the rate of the added pH buffer is less than 0.01 mole/mole of copper, the desired effect attained by the pH buffer is insufficient, while if it exceeds 1 mole/mole of copper, individual particles grow extremely larger and accordingly, the heat-curable conductive paste prepared using the copper fine powder has a tendency to reduce the content of the copper fine powder present therein. Moreover, the reaction (reducing reaction with a hydrazine reducing agent) temperature desirably ranges from about 40 to 60° C. This is because if the reaction temperature is less than 40° C., the rate of reduction is lowered, while if it exceeds 60° C., the resulting effect achieved does not correspond to or compensate the cost required for the heating, at all.

In the production method according to the present invention, if the hydrazine reducing agent is added to the reaction system at one portion or if it is not gradually added thereto, the copper fine powder finally obtained has scatter in the shape and particle size distribution thereof.

In addition, a substance such as gum arabic or gelatin may be added as a protective colloid when re-suspending the resulting cuprous oxide powder is re-suspended in a medium, such as water.

Moreover, the copper fine powder obtained after the reduction and filtration may be treated with an appropriate fatty acid in such an amount that a monomolecular film can be formed on each copper fine particle to thus impart stability against oxidation with time to the copper fine powder.

The copper fine powder prepared according to the foregoing method has an electrical resistance, as determined in the form of its powdery state, of not more than $1 \times 10^{-3} \Omega \cdot cm$; a specific surface area, as determined by the BET method, ranging from 0.15 to 0.3 $m^2/g$; a tap density of not less than 4.5 g/cc; a product of the tap density (g/cc) and the particle size ($\mu m$), of not less than 13, the particle size ($\mu m$) being calculated from the specific surface area according to the following equation:

Particle Size($\mu m$)=6/[8.93×[specific surface area, as determined by the BET method ($m^2/g$)]];

a particle size distribution observed in the microtrack measurement as expressed in terms of $D_{50}$ and $D_{90}$ ranging from 4 to 7 $\mu m$ and 9 to 11 $\mu m$, respectively; and a weight loss through hydrogen-reduction of not more than 0.30%.

As has been discussed above in detail, the copper fine powder of the present invention may satisfactorily fulfill the requirements for the characteristic properties of the raw materials used for preparing the heat-curable conductive paste. More specifically, the copper fine powder of the present invention shows excellent packing properties, in the resin substrate for multilayer printed wiring boards each having a VH structure, because of the high tap density and the narrow particle size distribution of the powder. Moreover, the copper fine powder has a polyhedral shape and therefore, has a high degree of contact between copper particles and shows a stable, low electrical resistance, in addition to the excellent packing properties. Further, when the heat-curable conductive paste is charged in the VH's using a squeegee and if the number of substrates to be continuously treated increases, the viscosity of the paste accommodated in the squeegee is not considerably changed, only a small amount of the paste is adhered to the substrate and thus, the number of substrates to be treated per lot is far advanced as compared with the conventional copper fine powder.

Accordingly, the present invention permits the substantial improvement in the quality and productivity of the resin substrate for multilayer printed wiring boards each having a VH structure.

The present invention will hereinafter be described in more detail with reference to the following Examples and Comparative Examples, but the present invention is by no means limited to these specific Examples.

EXAMPLE 1

There was dissolved 100 kg of copper sulfate (pentahydrate) in warm water to give 200 liters of an aqueous solution and the resulting solution was maintained at 60° C. To the aqueous solution, there was added 125 liters of a 25% by weight sodium hydroxide solution, followed by the reaction of them with stirring the mixture for one hour while maintaining the temperature at 60° C. to thus form cupric oxide.

To the foregoing reaction system, there was quantitatively added 80 liters of a 450 g/l glucose solution over one hour while maintaining the temperature of the former at 60° C. to form a cuprous oxide slurry. After the slurry was filtered and then washed, warm water was added to the cuprous oxide to re-suspend the same therein and to thus give 320 liters of a slurry, followed by addition of 1.5 kg of aminoacetic acid and 0.7 kg of gum arabic, stirring the mixture and maintenance of the temperature of the reaction mixture at 50° C. To the slurry, there was added 50 liters of a 20% hydrazine hydrate at a constant rate over one hour to give copper fine powder. The resulting copper fine powder slurry was filtered, sufficiently washed with pure water, then filtered and the resulting copper fine powder was immersed in methanol containing 25 g of oleic acid for 30 minutes, followed by the usual drying and a classification treatment to give copper fine powder. A micrograph (with a magnification of about ×10000) of the copper fine powder thus produced is shown in FIG. 1. As will be seen from FIG. 1, the resulting copper fine particles each has a polyhedral shape.

EXAMPLES 2 to 4

Each copper fine powder product was prepared by repeating the same procedures used in Example 1 except for changing the added amount of aminoacetic acid from 1.5 kg to 3 kg, 15 kg or 30 kg.

The copper fine powder products prepared in Examples 2 to 4 each has a polyhedral shape, like the copper fine powder prepared in Example 1.

Comparative Example 1

A copper fine powder product was prepared by repeating the same procedures used in Example 1 except that the addition of aminoacetic acid was omitted.

Comparative Example 2

A copper fine powder product was prepared by repeating the same procedures used in Example 1 except that 3 kg of aminoacetic acid was added to the copper sulfate aqueous solution prior to the initiation of the reaction.

Comparative Example 3

A copper fine powder product was prepared by repeating the same procedures used in Example 1 except for omitting the steps for filtering and washing the cuprous oxide slurry after the formation thereof.

Evaluation of Characteristic Properties

The copper fine powder products thus prepared were inspected for their characteristic properties. Separately, each of resin substrates for multilayer printed wiring boards each having a VH structure each was produced from a heat-curable conductive paste prepared using each copper fine powder product and then they were likewise inspected for their characteristic properties.

The copper fine powder products used herein as the subjects to be evaluated were 11 kinds of copper fine powder products, i.e., those prepared in Examples 1 to 4 and Comparative Examples 1 to 3, a product #12 (Comparative Example 4) commercially available from METZ Company, a product #13 (Comparative Example 5) available from METZ Company, copper powder (Comparative Example 6) available from Nippon Atomize Company, and the product C-200 (Comparative Example 7) available from Kyoto Elex Company and these copper fine powder products each was inspected for the electrical resistance as determined in the form of a powdery state; the specific surface area as determined by the BET method (BET specific surface area); a tap density; the product of the tap density (g/cc) and the particle size ($\mu$m) as calculated from the specific surface area; the particle size distribution observed in the microtrack measurement as expressed in terms of $D_{50}$ and $D_{90}$; and a weight loss through hydrogen-reduction. The results of these measurements are summarized in the following Table 1.

In order to inspect resin substrates for multilayer printed wiring boards having a VH structure, each of which had been produced from the heat-curable conductive paste prepared above using each corresponding copper fine powder product for their characteristic properties, the heat-curable conductive pastes each was first prepared by kneading 85% by weight of each copper fine powder product; 3% by weight of a bisphenol A type epoxy resin (Epikote 828, available from Yuka Shell Epoxy Company) and 9% by weight of an epoxy resin (YD-171, available from Tohto Chemical Industry Co., Ltd.) obtained by converting a dimer acid into a glycidyl ester, as resin components; and 3% by weight of Amineduct Curing Agent (MY-24 available from Ajinomoto Co., Ltd.) in a three-roll mill.

On the other hand, a substrate having a VH structure was prepared by forming 500 (20×25) through holes using a drill, each having a diameter of 0.2 mm in a lattice-like pattern, wherein the distance between the central axes of two neighboring through holes was set at 3 mm, on an aramid/epoxy sheet (resin substrate) having a thickness of 200 $\mu$m and a size of 10 cm×10 cm (R1661, available from Matsushita Electric Works, Ltd.).

A squeegee of stainless steel was arranged at an angle of 45° from the substrate, 100 substrates were continuously fed to the squeegee filled with 10 g of the paste prepared above so that the through holes of each substrate were filled with the paste.

Twentieth, 40th, 60th, 80th and 100th resin substrates for multilayer printed wiring boards each having a VH structure produced above using each heat-curable conductive paste containing the corresponding copper fine powder prepared in the foregoing Example or Comparative Example were visually inspected for the appearance of the through holes filled with the paste and the rate of residual copper fine powder component on the substrate, according to the following evaluation criteria:

Appearance of VH Filled with the Paste

○: When visually observing a sample substrate, all of the VH's were completely filled with the paste;

Δ: When visually observing a sample substrate, all of the VH's present in the substrate were filled with the paste, but there were observed VH's which were not completely filled therewith at a rate of not more than 5%;

X: All of the conditions other than those specified by the symbols ○ and Δ.

Rate of Residual Copper Fine Powder Component on Substrate

○: After the charging, there was not observed any paste component on a sample substrate at all;

Δ: When touching the substrate with a finger, after the VH's were filled with the paste, the finger became slightly dirty;

X: After the charging, the presence of the residual paste component on the substrate could visually be confirmed.

Separately, each of the 20th, 40th, 60th, 80th or 100th resin substrate whose VH's were filled with the paste was sandwiched with two copper foil having a thickness of 18 $\mu$m by pressing the resulting assembly with heating at a press temperature of 180° C., a pressure of 50 kg/cm$^2$ for 60 minutes to give a double-sided copper-clad sheet. Then an electrode pattern was formed according to the known etching technique, followed by determining the connection resistance of the inner via holes (via resistance).

The results thus obtained are listed in the following Tables 2 and 3. These data shown in Tables 2 and 3 clearly indicate that the substrates produced using the copper fine powder products prepared in Examples are excellent in packing properties, do not suffer from the problem of residual copper fine powder on the substrate and has a sufficiently low via resistance as compared with the substrates prepared using the copper fine powder of Comparative Examples.

TABLE 1

Results on Characteristic Property-Evaluation of Copper Fine Powder

| Ex. No. | Electrical Resistance ($\Omega \cdot$ cm) | Specific Surface Area (m$^2$/g) | Tap Density (g/cc) | Product: (BET Particle Size)[1]) × (Tap Density) | Microtrack Measurement ($\mu$m) $D_{50}$ | Microtrack Measurement ($\mu$m) $D_{90}$ | Weight Loss Through Hydrogen-Reduction (%) |
|---|---|---|---|---|---|---|---|
| 1 | 5.0 × 10$^{-5}$ | 0.225 | 5.11 | 15.3 | 5.68 | 9.88 | 0.21 |
| 2 | 7.5 × 10$^{-5}$ | 0.201 | 5.26 | 17.6 | 5.83 | 10.40 | 0.23 |
| 3 | 7.0 × 10$^{-5}$ | 0.171 | 5.22 | 20.5 | 5.81 | 9.87 | 0.25 |
| 4 | 7.1 × 10$^{-5}$ | 0.257 | 5.05 | 13.2 | 4.74 | 9.65 | 0.20 |
| 1* | 1.5 × 10$^{-4}$ | 2.077 | 2.73 | 0.9 | 1.22 | 6.82 | 0.75 |
| 2* | 7.5 × 10$^{-5}$ | 0.362 | 4.55 | 8.4 | 3.37 | 3.45 | 0.25 |

TABLE 1-continued

Results on Characteristic Property-Evaluation of Copper Fine Powder

| Ex. No. | Electrical Resistance ($\Omega \cdot cm$) | Specific Surface Area ($m^2/g$) | Tap Density (g/cc) | Product: (BET Particle Size)[1] × (Tap Density) | Microtrack Measurement ($\mu m$) $D_{50}$ | Microtrack Measurement ($\mu m$) $D_{90}$ | Weight Loss Through Hydrogen-Reduction (%) |
|---|---|---|---|---|---|---|---|
| 3 * | $1.5 \times 10^{-3}$ | 0.934 | 4.62 | 3.3 | 0.78 | 1.06 | 0.87 |
| 4 * | $8.2 \times 10^{-4}$ | 0.275 | 4.64 | 11.3 | 5.61 | 9.40 | 0.33 |
| 5 * | $3.6 \times 10^{-3}$ | 0.283 | 4.89 | 11.6 | 11.32 | 19.17 | 0.38 |
| 6 * | $2.0 \times 10^{-2}$ | 0.230 | 4.72 | 13.8 | 8.42 | 14.10 | 1.05 |
| 7 * | $6.4 \times 10^{-5}$ | 0.422 | 4.81 | 7.7 | 4.35 | 7.66 | 0.26 |

*: Comparative Example
[1] Particle size as determined by the BET method.

TABLE 2

| Ex. No. | No. of Treated Substrates (number) | Degree of VH Packing | Residual Copper Fine Powder on Substrate | Via Resistance ($\Omega \cdot cm$) |
|---|---|---|---|---|
| 1 | 20 | ○ | ○ | $0.3 \times 10^{-5}$ |
|   | 40 | ○ | ○ | $0.2 \times 10^{-5}$ |
|   | 60 | ○ | ○ | $0.4 \times 10^{-5}$ |
|   | 80 | ○ | ○ | $0.6 \times 10^{-5}$ |
|   | 100 | ○ | Δ | $0.6 \times 10^{-5}$ |
| 2 | 20 | ○ | ○ | $0.4 \times 10^{-5}$ |
|   | 40 | ○ | ○ | $0.3 \times 10^{-5}$ |
|   | 60 | ○ | ○ | $0.4 \times 10^{-5}$ |
|   | 80 | ○ | ○ | $0.3 \times 10^{-5}$ |
|   | 100 | ○ | ○ | $0.5 \times 10^{-5}$ |
| 3 | 20 | ○ | ○ | $0.2 \times 10^{-5}$ |
|   | 40 | ○ | ○ | $0.6 \times 10^{-5}$ |
|   | 60 | ○ | ○ | $0.3 \times 10^{-5}$ |
|   | 80 | ○ | ○ | $0.7 \times 10^{-5}$ |
|   | 100 | Δ | ○ | $0.5 \times 10^{-5}$ |
| 4 | 20 | ○ | ○ | $0.4 \times 10^{-5}$ |
|   | 40 | ○ | ○ | $0.5 \times 10^{-5}$ |
|   | 60 | ○ | ○ | $0.3 \times 10^{-5}$ |
|   | 80 | Δ | Δ | $0.6 \times 10^{-5}$ |
|   | 100 | Δ | Δ | $1.0 \times 10^{-5}$ |

TABLE 3

| Comp. Ex. No. | No. of Treated Substrates (number) | Degree of VH Packing | Residual Copper Fine Powder on Substrate | Via Resistance ($\Omega \cdot cm$) |
|---|---|---|---|---|
| 1 | 20 | ○ | ○ | $2.6 \times 10^{-5}$ |
|   | 40 | Δ | Δ | $4.4 \times 10^{-5}$ |
|   | 60 | X | Δ | $4.9 \times 10^{-5}$ |
|   | 80 | X | X | $10.5 \times 10^{-5}$ |
|   | 100 | X | X | $23.8 \times 10^{-5}$ |
| 2 | 20 | ○ | ○ | $1.2 \times 10^{-5}$ |
|   | 40 | Δ | ○ | $3.5 \times 10^{-5}$ |
|   | 60 | Δ | Δ | $5.9 \times 10^{-5}$ |
|   | 80 | X | Δ | $9.6 \times 10^{-5}$ |
|   | 100 | X | X | $12.5 \times 10^{-5}$ |
| 3 | 20 | ○ | ○ | $1.5 \times 10^{-5}$ |
|   | 40 | Δ | Δ | $3.8 \times 10^{-5}$ |
|   | 60 | Δ | Δ | $12.2 \times 10^{-5}$ |
|   | 80 | X | X | $75.1 \times 10^{-5}$ |
|   | 100 | X | X | $98.8 \times 10^{-5}$ |
| 4 | 20 | ○ | ○ | $0.7 \times 10^{-5}$ |
|   | 40 | Δ | ○ | $7.5 \times 10^{-5}$ |
|   | 60 | Δ | ○ | $6.6 \times 10^{-5}$ |
|   | 80 | X | Δ | $32.5 \times 10^{-5}$ |
|   | 100 | X | X | $56.2 \times 10^{-5}$ |
| 5 | 20 | ○ | ○ | $0.9 \times 10^{-5}$ |
|   | 40 | Δ | ○ | $3.5 \times 10^{-5}$ |
|   | 60 | Δ | Δ | $15.5 \times 10^{-5}$ |
|   | 80 | X | Δ | $42.8 \times 10^{-5}$ |
|   | 100 | X | X | $75.7 \times 10^{-5}$ |
| 6 | 20 | ○ | ○ | $35.1 \times 10^{-5}$ |
|   | 40 | Δ | Δ | $65.9 \times 10^{-5}$ |
|   | 60 | Δ | Δ | $57.7 \times 10^{-5}$ |
|   | 80 | Δ | Δ | $82.4 \times 10^{-5}$ |
|   | 100 | X | X | $112 \times 10^{-5}$ |
| 7 | 20 | ○ | ○ | $0.3 \times 10^{-5}$ |
|   | 40 | ○ | ○ | $0.9 \times 10^{-5}$ |
|   | 60 | Δ | Δ | $1.8 \times 10^{-5}$ |
|   | 80 | X | Δ | $4.6 \times 10^{-5}$ |
|   | 100 | X | Δ | $3.9 \times 10^{-5}$ |

What is claimed is:

1. Copper fine powder having an electrical resistance, as determined in the form of its powdery state, of not more than $1 \times 10^{-3} \Omega \cdot cm$; a specific surface area, as determined by the BET method, ranging from 0.15 to 0.3 $m^2/g$; a tap density of not less than 4.5 g/cc; a product of the tap density (g/cc) and a particle size ($\mu m$), of not less than 13, the particle size ($\mu m$) being calculated from the specific surface area ($m^2/g$) according to the following equation:

Particle Size($\mu m$)=6/(8.93×(specific surface area, as determined by the BET method ($m^2/g$)));

a particle size distribution obtained by microtrack measurement as expressed in terms of $D_{50}$ and $D_{90}$ ranging from 4 to 7 $\mu m$ and 9 to 11 $\mu m$, respectively; and a weight loss through hydrogen-reduction of not more than 0.30%.

* * * * *